United States Patent
Anderson et al.

(10) Patent No.: US 7,521,280 B1
(45) Date of Patent: Apr. 21, 2009

(54) METHOD FOR FORMING AN OPTICAL IMAGE SENSOR WITH AN INTEGRATED METAL-GATE REFLECTOR

(75) Inventors: Brent Alan Anderson, Jericho, VT (US); John Joseph Ellis-Monaghan, Grand Isle, VT (US); Edward J. Nowak, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/184,125

(22) Filed: Jul. 31, 2008

(51) Int. Cl.
*H01L 21/00* (2006.01)

(52) U.S. Cl. .............. 438/72; 438/24; 438/60; 438/69; 438/E27.154

(58) Field of Classification Search ............. 438/22–24, 438/48–60, 69–72, 73–75; 257/27.154
See application file for complete search history.

(56) References Cited

U.S. PATENT DOCUMENTS

| 7,160,753 | B2 | 1/2007 | Williams, Jr. | 438/73 |
| 7,279,764 | B2 | 10/2007 | Mouli | 257/436 |
| 2004/0217394 | A1 | 11/2004 | Lee | 257/291 |
| 2005/0242368 | A1 | 11/2005 | Udrea et al. | 257/107 |
| 2005/0242369 | A1 | 11/2005 | Udrea et al. | 257/107 |
| 2008/0023738 | A1* | 1/2008 | Lenchenkov | 257/294 |

* cited by examiner

*Primary Examiner*—Dung A. Le
(74) *Attorney, Agent, or Firm*—Zilka-Kotab, PC

(57) ABSTRACT

A method according to one embodiment includes forming a photosensitive region on an substrate; forming at least one dielectric layer upon the photosensitive region; simultaneously forming and patterning a metal layer upon the photosensitive region; wherein a first portion of the metal layer is formed upon the photosensitive region and serves as an optical reflector; wherein a second portion of the metal layer is formed in a transfer gate region and serves as a metal gate electrode for a transfer gate transistor.

1 Claim, 3 Drawing Sheets

METHOD FOR FORMING AN OPTICAL IMAGE SENSOR WITH AN INTEGRATED METAL-GATE REFLECTOR

BACKGROUND

The present invention relates to sensors, and more particularly, this invention relates to forming optical image sensors.

Image sensors find applications in a wide variety of fields, including machine vision, robotics, astronomy, navigation, as well as consumer products. While complementary metal-oxide-semiconductor (CMOS) technology has provided the foundation for advances in low-cost, low-power, reliable, highly integrated systems for many consumer applications, charge coupled devices (CCDs) have been, until recently, the primary technology used in electronic imaging applications. CCDs, however, are high capacitance devices that require high voltage clocks, consume large amounts of power, provide only serial output, and require specialized silicon processing that is incompatible with CMOS technology. The availability of sub-micron CMOS technology and the advent of active pixel sensors (APS) have made CMOS technology more attractive for imaging applications.

SUMMARY

A method according to one embodiment includes forming a photosensitive region on a substrate; forming at least one dielectric layer upon the photosensitive region; simultaneously forming and patterning a metal layer upon the photosensitive region; wherein a first portion of the metal layer is formed upon the photosensitive region and serves as an optical reflector; wherein a second portion of the metal layer is formed in a transfer gate region and serves as a metal gate electrode for a transfer gate transistor.

Other aspects, advantages and embodiments of the present invention will become apparent from the following detailed description, which, when taken in conjunction with the drawings, illustrate by way of example the principles of the invention.

DETAILED DESCRIPTION

The following description is made for the purpose of illustrating the general principles of the present invention and is not meant to limit the invention concepts claimed herein. Further, particular features described herein can be used in combination with other described features in each of the various possible combinations and permutations.

Unless otherwise specifically defined herein, all terms are to be given their broadest possible interpretation including meanings implied from the specification as well as meanings understood by those skilled in the art and/or as defined in dictionaries, treatises, etc.

It must also be noted that, as used in the specification and the appended claims, the singular forms "a," "an" and "the" include plural referents unless otherwise specified.

In one general embodiment, a method is provided for forming a pixel sensor cell. In operation, a photosensitive region is formed on a substrate. Additionally, at least one dielectric layer is formed upon the photosensitive region. Furthermore, a metal layer is simultaneously formed and patterned upon the photosensitive region, wherein a first portion of the metal layer is formed upon the photosensitive region and serves as an optical reflector, and a second portion of the metal layer is formed in a transfer gate region and serves as a metal gate electrode for a transfer gate transistor.

In another general embodiment, a method is provided for forming optical imaging structure. In operation, an optical collector semiconductor area is formed. Additionally, a transfer device semiconductor area is formed. Further, at least one dielectric type is formed over the optical collector and the transfer device semiconductor areas. Still yet, a metal is simultaneously formed over at least a portion of the optical collector and the transfer device semiconductor areas. Moreover, the metal formed over the optical collector semiconductor area serves as an optical reflector and the metal formed over the transfer device semiconductor area serves as a gate electrode for a transfer transistor.

In another general embodiment, an optical imaging structure is provided including a metal gate electrode over a transfer field effect transistor (FET) and a metal reflector, which was simultaneously formed with the metal gate electrode, over a collection area.

More illustrative information will not be set forth regarding various optional architectures and features with which the foregoing framework may or may not be implemented, per the desires of the user. It should be strongly noted that the following information is set forth for illustrative purposes and should not be construed as limiting in any manner. Any of the following features may be optionally incorporated with or without the exclusion of other features described.

Figure 1:
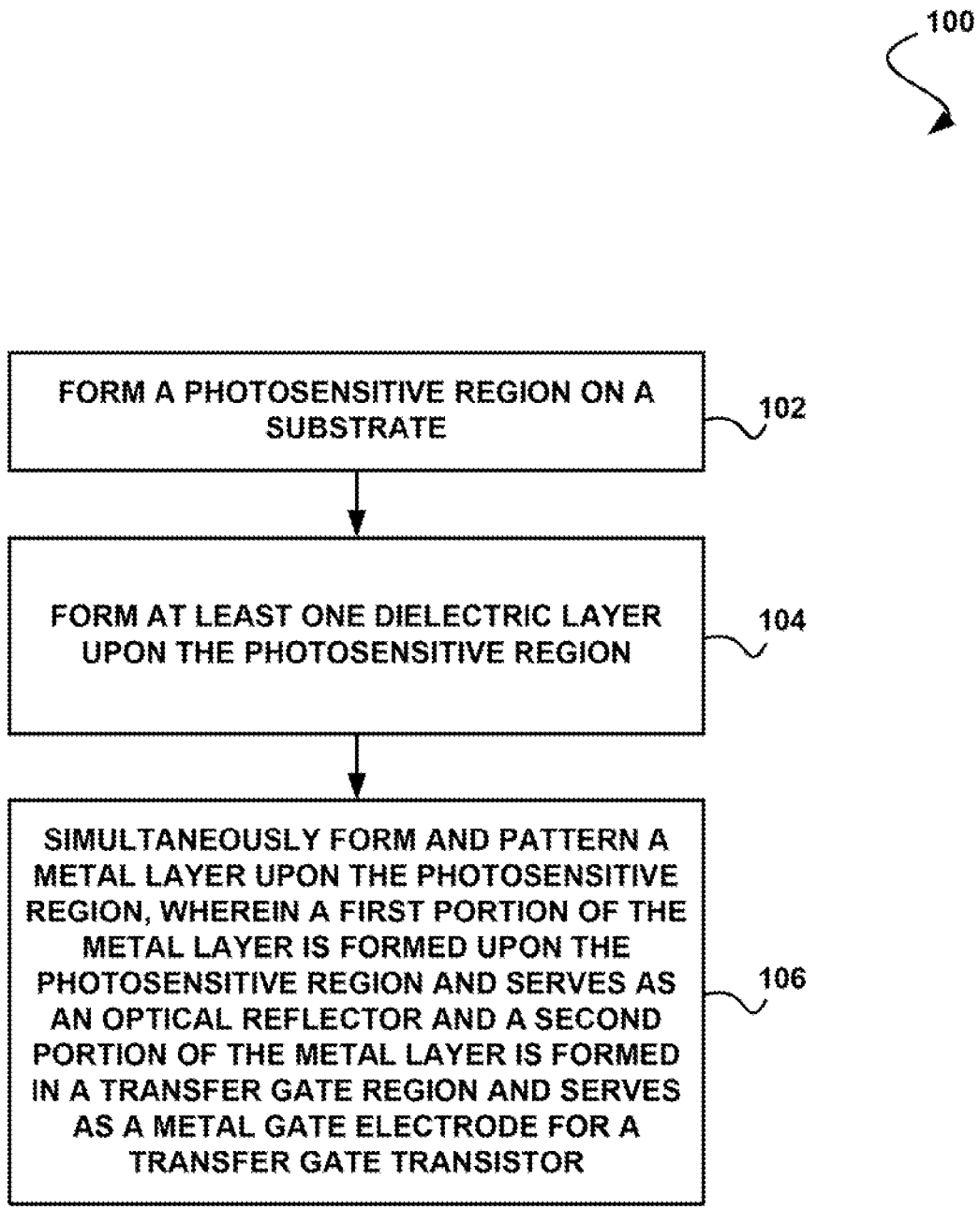
FIG. 1 shows a method for forming an optical imaging structure, in accordance with one embodiment.

FIG. 1 shows a method 100 for forming an optical imaging structure, in accordance with one embodiment.

As shown, a photosensitive region is formed on a substrate. See operation 102. In one embodiment, the photosensitive region may include silicon. As an option, the substrate may include a silicon substrate.

Additionally, at least one dielectric layer is formed upon the photosensitive region. See operation 104. In one embodiment, the dielectric layer may include $SiO_2$.

Furthermore, a metal layer is simultaneously formed and patterned upon the photosensitive region. See operation 106. In this case, a first portion of the metal layer is formed upon the photosensitive region and serves as an optical reflector.

Still yet, a second portion of the metal layer is formed in a transfer gate region and serves as a metal gate electrode for a transfer gate transistor. It should be noted that the metal may include any suitable metal.

In this way, a metal gate material may be used to cover the top of the optical sensing portion of a silicon substrate. The substrate wafer may then be removed and imaging be accomplished from what was the substrate side of the device. Thus, AN optical imaging structure may be formed that includes a metal gate electrode over a transfer field effect transistor (FET) and a metal reflector, which was simultaneously formed with the metal gate electrode, over a collection area.

In one embodiment, a metal gate already present in a high-k metal-gate complementary metal-oxide-semiconductor (CMOS) may be utilized to enhance the collection efficiency of the integrated CMOS optical image sensor.

FIGS. 2A-2D show a process 200 for forming an enhanced optical imaging structure, in accordance with another embodiment. As an option, the present method 200 may be implemented in the context of the functionality of FIG. 1. Of course, however, the method 200 may be carried out in any desired environment. It should also be noted that the aforementioned definitions may apply during the present description.

Figure 2A:
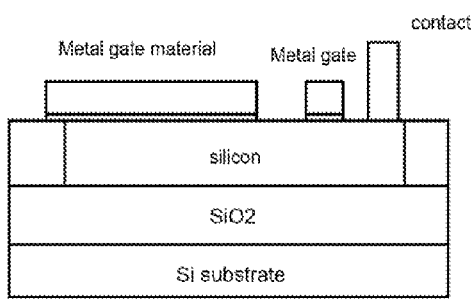
FIGS. 2A-2D show a process for forming an enhanced optical imaging structure, in accordance with another embodiment.

In operation, an optical imaging structure is provided, as shown in FIG. 2A. In this case, the structure may include one or more metal gates composed of a metal gate material, a metal reflector, and one or more contacts.

Figure 2B:
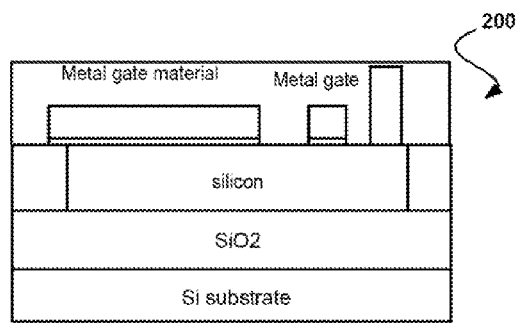
Figure 2C:
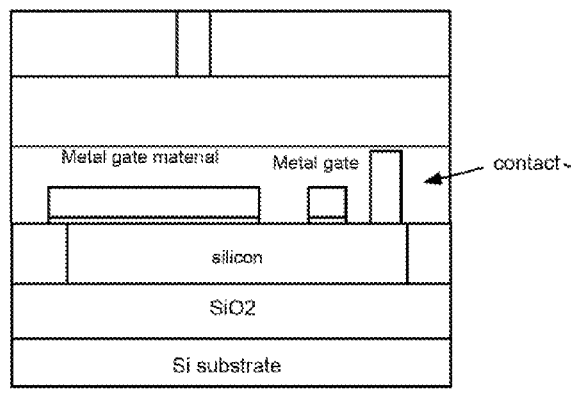

One or more layers of interconnect (e.g. wires or vias) are formed on the structure, as shown in FIGS. 2B and 2C. A silicon substrate of the structure is then removed, the old top is bonded to a new mounting substrate, a mask layer is added, and a passivation process is implemented, as shown in FIG. 2D.

Figure 2D:
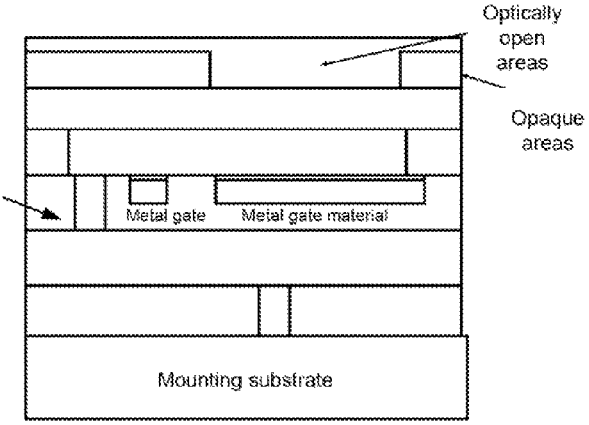
Figure 3:
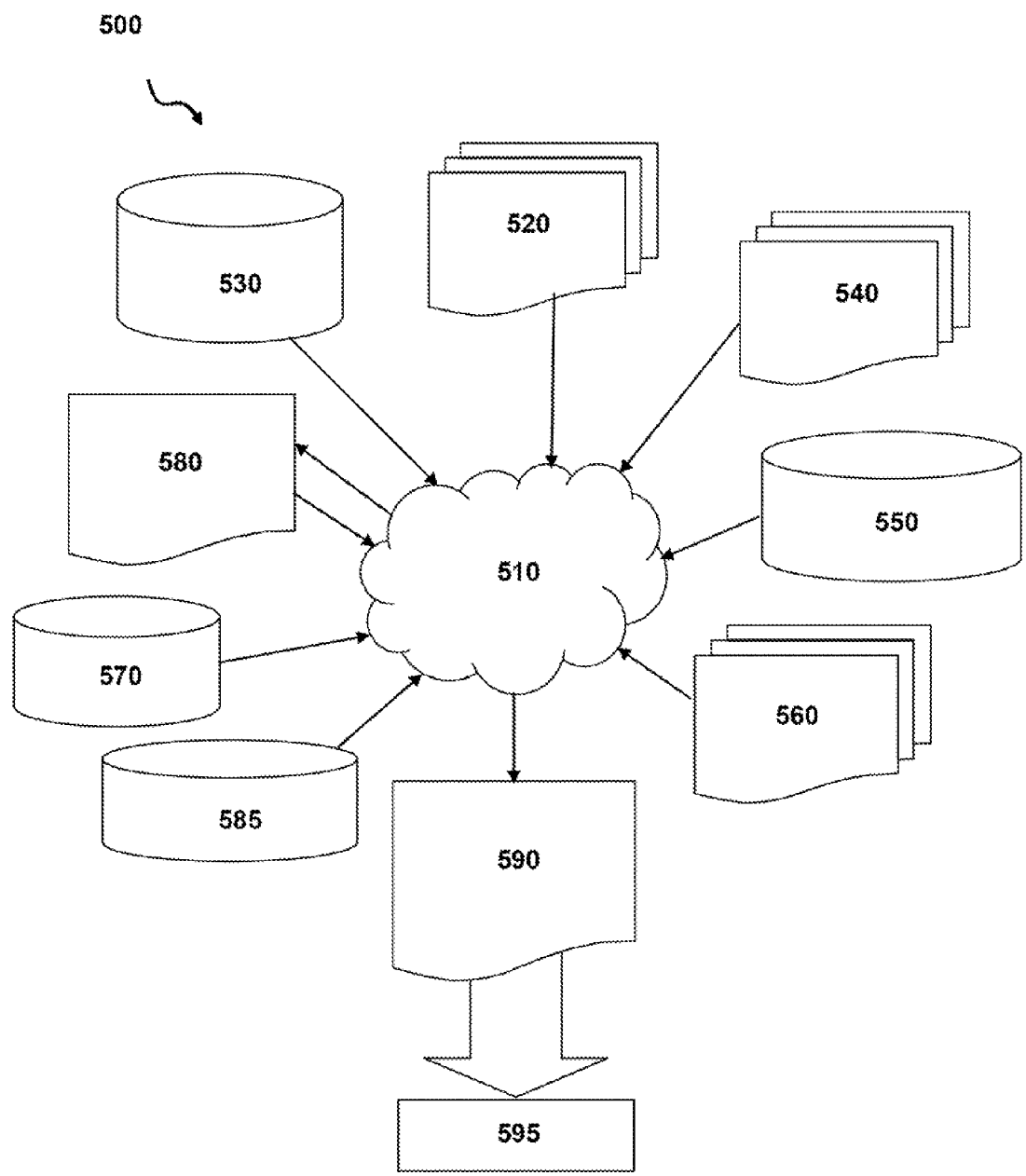
FIG. 3 shows a block diagram of an examplary design flow used for example, in semiconductor design, manufacturing, and/or test.

FIG. 3 shows a block diagram of an examplary design flow 500 used for example, in semiconductor IC logic design, simulation, test, layout, and manufacture. Design flow 500 includes processes and mechanisms for processing design structures or devices to generate logically or otherwise functionally equivalent representations of the design structures and/or devices described above and shown in FIGS. 1-2D. The design structures processed and/or generated by design flow 500 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Design flow 500 may vary depending on the type of representation being designed. For example, a design flow 500 for building an application specific IC (ASIC) may differ from a design flow 500 for designing a standard component or from a design flow 500 for instantiating the design into a programmable array, for example a programmable gate array (PGA) or a field programmable gate array (FPGA) offered by Altera® Inc. or Xilinx® Inc.

FIG. 3 illustrates multiple such design structures including an input design structure 520 that is preferably processed by a design process 510. Design structure 520 may be a logical simulation design structure generated and processed by design process 510 to produce a logically equivalent functional representation of a hardware device. Design structure 520 may also or alternatively comprise data and/or program instructions that when processed by design process 510, generate a functional representation of the physical structure of a hardware device. Whether representing functional and/or structural design features, design structure 520 may be generated using electronic computer-aided design (ECAD) such as implemented by a core developer/designer. When encoded on a machine-readable data transmission, gate array, or storage medium, design structure 520 may be accessed and processed by one or more hardware and/or software modules within design process 510 to simulate or otherwise functionally represent an electronic component, circuit, electronic or logic module, apparatus, device, or system such as those shown in FIGS. 1-2D. As such, design structure 520 may comprise files or other data structures including human and/or machine-readable source code, complied structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 510 preferably employs and incorporates hardware and/or software modules for synthesizing, translating, or otherwise processing a design/simulation functional equivalent of the components, circuits, devices, or logic structures shown in FIGS. 1-2D to generate a netlist 580 which may contain design structures such as design structure 520. Netlist 580 may comprise, for example, complied or otherwise processed data structures representing a list of wires, discrete components, logic gates, control circuits, I/O devices, models, etc. that describes the connections to other elements and circuits in an integrated circuit design. Netlist 580 may be synthesized using an iterative process in which netlist 580 is resynthesized one or more times depending on design specifications and parameters for the device. As with other design structure types described herein, netlist 580 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 510 may include hardware and software modules for processing a variety of input data structure types including netlist 580. Such data structure types may reside, for example, within library elements 530 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 540, characterization data 550, verification data 560, design rules 570, and test data files 585 which may include input test patterns, output test results, and other testing information. Design process 510 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 510 without deviating from the scope and spirit of the invention. Design process 510 may also include modules for performing standard circuit design processes such as timing analysis, verification, design rule checking, place and route operations, etc.

Design process 510 employs and incorporates logic and physical design tools such as HDL compilers and simulation model build tools to process design structure 520 together with some or all of the depicted supporting data structures along with any additional mechanical design or data (if applicable), to generate a second design structure 590. Design structure 590 resides on a storage medium or programmable gate array in a data format used for the exchange of data of mechanical devices and structures (e.g. information stored in a IGES, DXF, Parasolid XT, JT, DRG, or any other suitable format for storing or rendering such mechanical design structures). Similar to design structure 520, design structure 590 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 1-2D. In one embodiment, design structure 590 may comprise a compiled, executable HDL simulation model that functionally simulates the devices shown in FIGS. 1-2D.

Design structure 590 may also employ a data format used for the exchange of layout data of integrated circuits and/or symbolic data format (e.g. information stored in a GDSII (GDS2), GL1, OASIS, map files, or any other suitable format for storing such design data structures). Design structure 590 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 1-2D. Design structure 590 may then proceed to a stage 595 where, for example, design structure 590 proceeds to tape-out, is released to manufacturing, is released to a mask house, is sent to another design house, is sent back to the customer, etc.

While various embodiments have been described above, it should be understood that they have been presented by way of example only, and not limitation. Thus, the breadth and scope of a preferred embodiment should not be limited by any of the above-described examplary embodiments, but should be defined only in accordance with the following claims and their equivalents.

What is claimed is:

1. A method, comprising:
   forming a photosensitive region on a substrate;
   forming at least one dielectric layer upon the photosensitive region;
   simultaneously forming and patterning a metal layer upon the photosensitive region;
   wherein a first portion of the metal layer is formed upon the photosensitive region and serves as an optical reflector; and
   wherein a second portion of the metal layer is formed in a transfer gate region and serves as a metal gate electrode for a transfer gate transistor.

* * * * *